(12) United States Patent
Petersen et al.

(10) Patent No.: US 7,301,846 B2
(45) Date of Patent: Nov. 27, 2007

(54) METHOD AND APPARATUS FOR INCREASING COMPUTER MEMORY PERFORMANCE

(75) Inventors: Ryan M. Petersen, Sunnyvale, CA (US); Eric L. Nelson, Rancho Palos Verdes, CA (US)

(73) Assignee: OCZ Technology Group, Inc., Sunnyvale, CA (US)

( * ) Notice: Subject to any disclaimer, the term of this patent is extended or adjusted under 35 U.S.C. 154(b) by 257 days.

(21) Appl. No.: 10/711,653

(22) Filed: Sep. 29, 2004

(65) Prior Publication Data

US 2005/0266711 A1   Dec. 1, 2005

Related U.S. Application Data

(60) Provisional application No. 60/521,567, filed on May 25, 2004.

(51) Int. Cl.
*G11C 5/14* (2006.01)
(52) U.S. Cl. .................. 365/226; 365/227; 365/228
(58) Field of Classification Search ............... 365/226, 365/227, 228
See application file for complete search history.

(56) References Cited

U.S. PATENT DOCUMENTS 6,826,107 B2 * 11/2004 Dvir et al. .................. 365/226
7,143,298 B2 * 11/2006 Wells et al. ................. 713/300
2006/0056215 A1 * 3/2006 Petersen et al. .............. 365/51
2006/0212645 A1 * 9/2006 Petersen et al. ............. 711/103

* cited by examiner

*Primary Examiner*—Son Dinh
*Assistant Examiner*—Hien N Nguyen
(74) *Attorney, Agent, or Firm*—Gary M. Hartman; Domenica N. S. Hartman; Hartman & Hartman, P.C.

(57) ABSTRACT

A method and apparatus for providing power to a memory array of a computer's memory subsystem, and more particularly power at a level greater than that available through the computer motherboard so as to boost memory performance and operational stability. The apparatus includes a supply device for supplying an input voltage to the memory subsystem at a level that is higher than the power level provided to the memory subsystem by the motherboard. The method entails electrically connecting the supply device to the memory subsystem, and then electrically connecting a power source to the device to deliver the input voltage to the memory subsystem. The additional input voltage supplied to the memory subsystem causes memory chips on memory modules of the memory subsystem to run at higher frequencies, such that the various internal operations of the memory, such as reading and writing, occur more quickly.

32 Claims, 2 Drawing Sheets

METHOD AND APPARATUS FOR INCREASING COMPUTER MEMORY PERFORMANCE

CROSS REFERENCE TO RELATED APPLICATIONS

This application claims the benefit of U.S. Provisional Application No. 60/521,567, filed May 25, 2004.

BACKGROUND OF THE INVENTION

The present invention generally relates to the operation and performance of computers, and more particularly to methods and devices for increasing memory frequency range and performance of a computer through the use of an alternate source of power supplied to a computer's memory modules.

Memory bandwidth requirements of computers have steadily increased as a countermeasure against data starvation of a computer's central processor. A number of different strategies have been employed to provide better data throughput to and from the system memory pool. The three most important measures have been to increase the memory clock frequency, to increase the data rate, and to increase the number of physical banks to allow for more pages that can be held open.

As a general rule, power consumption of any integrated circuit increases in a linear fashion with the clock frequency and, therefore, the migration to higher memory core frequencies necessarily results in higher power draw. Likewise, the increased power consumption of open memory pages is well documented. Combined, the higher operating frequency, along with the increased system memory density, and higher number of ranks/open pages have reached a stage where the supply of onboard power to the memory array becomes the limiting factor for operability.

Fast transients can be buffered by means of the addition of higher capacitance in the form of electrolytic capacitors. However, there is a limitation to the effectiveness of such passive voltage buffers. Specifically, the closer the net sum of all idle and duty cycle power figures multiplied by the number of physical devices gets to the sustained supply capability of the MVRM (memory voltage regulator module) the less overhead will there be that can be converted into a power reservoir in the form or electrochemical energy. As a result, the electrolytic capacitors can also be starved and become a counterproductive asset in the net equation of power supply to the memory.

An additional concern relates to the cost-saving policies in place with many system manufacturers. That is, in the absence of detailed specifications of the power requirements that any MVRM must meet, it is up to third party manufacturers to provide more or less minimalist solutions that will work under what is referred to as typical operating conditions but will not suffice for either extreme load on the memory bus in terms of data traffic or else very high amounts of system memory. The two aforementioned scenarios are representative for high-end desktop configurations and the server environment, respectively. In both cases, insufficiencies in the memory power supply circuitry effectively pose a bottleneck for system performance and, by extension, operational stability, and can cause power related errors and memory failure.

Finally, many memory chips are able to run at higher frequencies with higher voltages as the noise margins become wider and more drive current is supplied to the memory. This increased drive current allows the clock to switch at higher frequencies as well as allowing the various internal operations of the memory, such as reading and writing, to occur much more quickly, thus increasing memory performance.

Power for standard memory subsystems (memory supply voltage; $V_{DD}/V_{DDQ}$) is typically in a range of about 2.5 to about 2.6 volts. Although a limited number of high-end motherboards (mainboards) allow for variable memory module voltage (VDIMM) up to approximately 3.0 to 3.2V, most motherboards have either no voltage adjustment capabilities due to cost considerations, or a limited voltage range due to compatibility concerns. While power drawn for memory subsystems is typically at a higher voltage (e.g. usually from the 3.3 volt rail (line) of the computers' power supply unit (PSU; e.g., an ATX Form Factor), and less frequently from the 5-volt and 12-volt lines of an ATX), circuitry on the motherboard reduces the voltage before being supplied to the memory subsystem. However, many memory chips have become much more tolerant to higher voltages as absolute maximum ratings from the semiconductor foundries have been improved. Because higher voltages to the memory chips of a computer's memory subsystem can boost memory performance and, consequently, system performance and operational stability, some computer users have resorted to modifying the motherboard to allow it to pass a higher voltage to the memory subsystem.

In view of the above, the limitations of conventional MVRM's are generally hardware-based, such that there is no headroom for improvement without taking the potentially risky step of modifying the motherboard. Even budget MVRM solutions are generally carefully balanced for an optimal price performance ratio. Any intrusion into the given equilibrium will result in shortcomings of one type or the other. Therefore, there remains a need for reducing the degree to which power supply to the memory array of a computer limits operability, with the result that better data throughput to and from the system memory pool is achieved.

BRIEF SUMMARY OF THE INVENTION

The present invention provides a method and apparatus for providing power to a memory array of a memory subsystem of a computer, and more particularly power at a level greater than that available through the computer motherboard so as to boost memory performance and, consequently, system performance and operational stability.

The apparatus comprises a supply means for supplying an input voltage to the memory subsystem at a level that is higher than the power level provided to the memory subsystem by the motherboard. According to a preferred embodiment, the supply means is configured for plugging into an available memory slot of the memory subsystem to deliver the input voltage to the memory subsystem. The method comprises electrically connecting the supply means to the memory subsystem, electrically connecting a power source to the supply means, and delivering an input voltage to the memory subsystem with the supply means. The additional input voltage (and resulting drive current) supplied to the memory subsystem improves memory performance by causing the memory chips on memory modules installed in the memory subsystem to run at higher frequencies, such that the various internal operations of the memory, such as reading and writing, occur more quickly. The capability of using higher switching frequencies shortens the lag between demand and supply within the memory subsystem, and shortens the lag between reduced demand and power throttling. According to a preferred aspect of the invention, the input voltage to the memory system can be adjusted by the user in order to optimize system performance and operational stability.

In view of the above, it can be seen that the invention is able to provide the above-noted benefits with an uncomplicated apparatus and using an uncomplicated installation method. The apparatus can be modular if desired, and can be used to retrofit essentially any existing systems, including desktop configurations and servers. The input voltage to the memory subsystem can be memory voltage (e.g., VDIMM) or other voltages related to memory performance. Since the application of external voltage can be applied in parallel with the motherboard power circuitry, the existing trace routing on the motherboard can remain unchanged. Furthermore, should memory density be increased, the resulting additional system memory power consumption are not seen by the motherboard or other components thereon, and therefore does not detrimentally affect the performance of the motherboard or its components. Because the motherboard is not directly supplying power to the memory subsystem, heat generation by the MVRM on the motherboard may be greatly reduced.

The modular design capability of this invention is particularly desirable for use in the server market, in that it allows flexible memory configurations without any power concerns. In case the power supply capabilities of the external supply approach a critical level, additional supplies can be added in parallel to warrant optimal power for each module irrespective of the number thereof. Furthermore, in server environments with memory expansion cards, the power supply can be an integrated element of the expansion card.

Other objects and advantages of this invention will be better appreciated from the following detailed description.

DETAILED DESCRIPTION OF THE INVENTION

Figure 1:
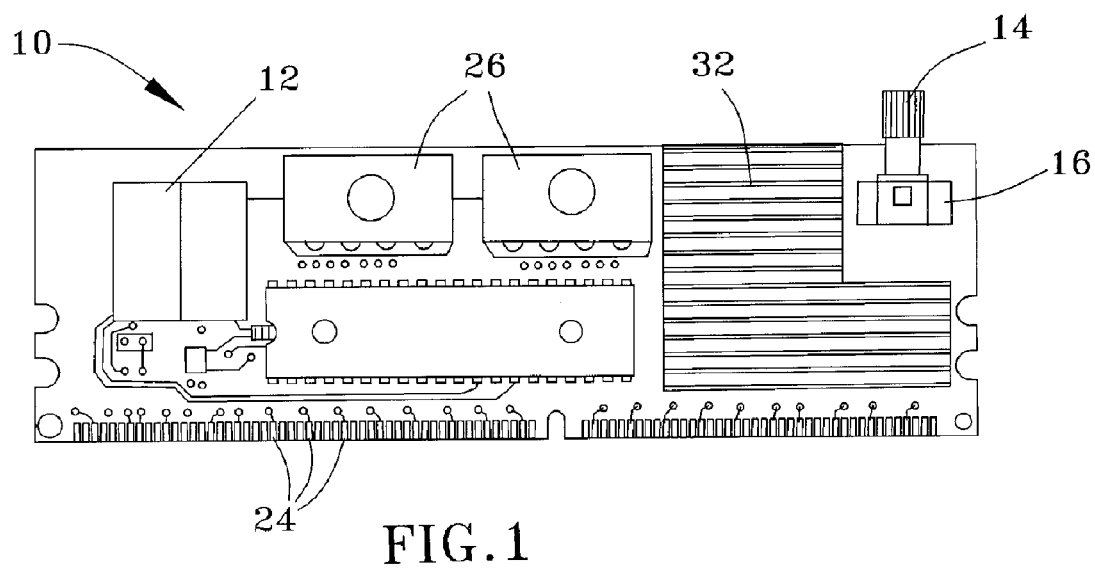
FIG. 1 represents a device for increasing the input voltage to computer memory modules in accordance with a preferred embodiment of this invention.

The present invention provides an apparatus and method for reducing the degree to which power supply to the memory array of a computer limits memory performance, with the result that better data throughput to and from the system memory pool is achieved. While the invention will be described in reference to DIMM modules (SDRAM, DDR-DRAM), those skilled in the art will recognize that the invention has potential applicability other memory systems, including those yet to be developed.

According to the invention, parallel or series circuitry is employed to provide an additional source of power to the memory array of a computer's memory subsystem through a device that can be plugged into an available memory slot on a computer's motherboard. By installing the device in a memory slot, the device is linked to the memory bus for delivering power to each of the memory modules installed on the motherboard, and to the motherboard itself. The additional power source raises the voltage available to the memory subsystem (VDIMM, Vref (reference voltage), and/or Vtt (tracking termination voltage)) and provides additional drive current when memory demands. For example, VDIMM can be raised from typical levels of about 2.5-2.6 volts to well in excess of 3.3 volts. As such, the apparatus is useful for what is known as "overclocking" of computer memory modules.

According to a preferred aspect of the invention, the additional power source can be accomplished by routing in additional power from the computer's power supply unit (e.g., an ATX power supply), or routing in power from outside the main computer power supply through external circuitry, to a device that simply plugs into an available memory slot on the motherboard. According to a first embodiment of the invention, the first approach can be accomplished by connecting the device to one or more available voltage rails (lines) from the computer's power supply unit (PSU). As noted above and known in the art, an ATX PSU provides, in addition to a direct 3.3-volt supply, a direct 5-volt supply as well as a negative 5-volt supply and a 12-volt signal usually supplied to fans, disk drives, and other storage devices. To maximize input voltage and drive current to the memory subsystem, the 5-volt supply rail can be used as the source of power delivered to the device. This approach is preferably accomplished using secondary (interfacing) circuitry on the device to interface with the memory. If suitable interface means is used, the device can also be used to provide power to other power circuitry on the motherboard, including but not limited to $V_{TT}$, $V_{REF}$, and any other supply voltage, and not just the memory supply voltage ($V_{DD}/V_{DDQ}$). For example, in addition to the device supplying $V_{DD}/V_{DDQ}$ to the memory subsystem through an available memory slot on the motherboard, supply voltage can also be supplied by the device 10 to power circuitry on the motherboard using a flying lead, soldered connection, etc. The device is also preferably equipped with voltage control circuitry, so that the input voltage to the memory subsystem can be adjusted.

According to the second approach, power from outside of the computer is routed via external circuitry to the device. As a second embodiment of the invention, this approach employs a transformer circuit to convert AC power from an available wall socket into DC power, similarly to the computers PSU. As with the first embodiment, the adjusted input voltage can then be fed directly to the memory modules via the device, or fed to the memory modules through interfacing circuitry on the device and/or on the motherboard. Also similar to the first embodiment, voltage control circuitry is preferably provided, such as on the device, so that the input voltage to the memory subsystem can be adjusted.

The first approach may be preferable in many circumstances, since the approach is relatively easy to implement, being relatively uncomplicated to install and use. Production costs for the first approach are also potentially lower compared to the second approach. On the other hand, the second approach has the potential for achieving excellent power characteristics, as a much greater amount of current can be supplied to the memory subsystem than if the power is drawn from the same computer PSU as the rest of the motherboard, CPU, and other components within the computer. Additionally, the second approach could potentially have the advantage of avoiding any ground bouncing that might occur in a situation of insufficient capacitance and open source drainage of the onboard ground traces to the memory slots. For both approaches attachment could be implemented through a soldered connection instead of standard contacts that are subject to reflection and alteration of the contact surface by, for example, corrosion and deposits.

With any one of the approaches discussed above, the application of the external power preserves the requirements of the sequence of power-up as described in the DRAM specification or by any other memory technology that the teachings of the present invention are applied to. It is foreseeable that alternative approaches and methods can be devised for delivering higher voltage to the memory subsystem of a computer through a device that plugs into an available memory slot of the memory subsystem. In addition, various alternatives are possible for implementing the interfacing circuitry between the source of higher voltage and the memory subsystem. As such, the embodiments described above and illustrated in the Figures are intended to be illustrative examples only, and do not limit the scope of the invention.

FIG. 1 represents a device 10 suitable for plugging into an available memory slot in accordance with the present invention. The device 10 is represented as being in the form of a printed circuit board (PCB) on which all of the above-noted circuitry and voltage adjustment and readout features are located, though the device 10 could comprise multiple separate but interconnected units. The device 10 is configured to plug directly into a motherboard (not shown) via an empty memory slot (socket), such as a DIMM (SDRAM, DDR-DRAM) slot (not shown). For this reason, the device 10 appears very similar to a memory module, and has along an edge thereof pins 24 of an appropriate number (e.g., 184). The device 10 is also shown as being equipped with a pair of connectors 26 through which power is received from the PSU. The connectors 26 are preferably of the Molex-type, though other types of connectors could foreseeably be used.

Figure 4:
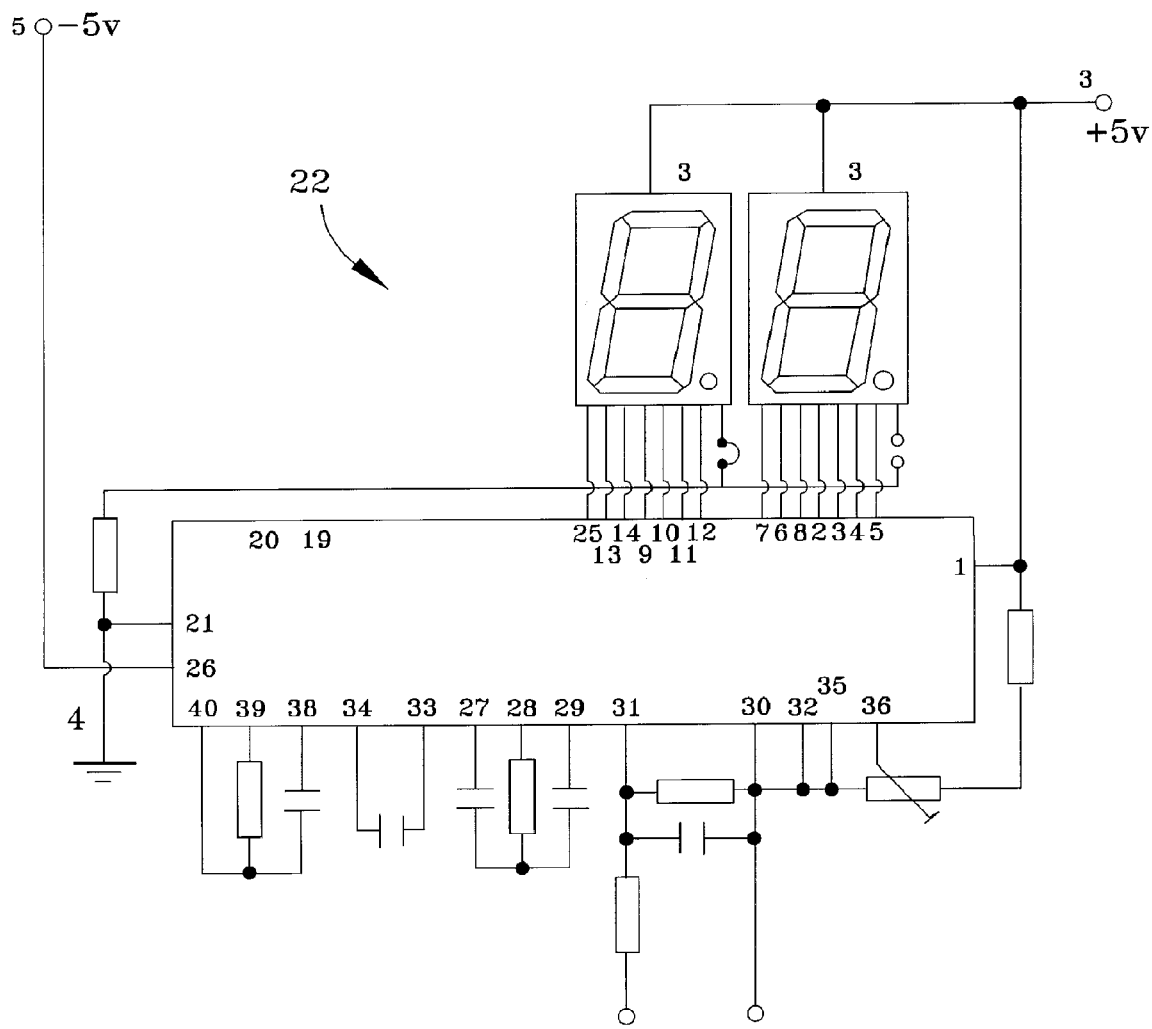
FIG. 4 is a schematic of a voltage readout circuit for use with the device of FIG. 1 in accordance with a preferred aspect of this invention.

As seen in FIG. 1, the device 10 is further equipped with a readout 12 (such as an LED) to display the voltage being supplied by the device 10. FIG. 4 schematically represents a suitable circuit 22 for the readout 12. In addition to being useful for diagnostic purposes, the readout 12 can be used to provide visual feedback during adjustment of the VDIMM voltage. In FIG. 1, such an adjustment capability is depicted as being available through a knob 14 coupled to a variable resistor (potentiometer) 16. With the knob 14, the voltage supplied by the device 10 to the memory subsystem in which the device 10 is installed can be readily adjusted. Typically, the lower end of the adjustment range will be as low as the voltage that the motherboard supplies, e.g., 2.5 to 2.6 volts. Depending on the power supply to the device 10, the upper end of the adjustment range need not be hardware-limited in terms of the power supply, but instead will typically be limited by the voltage that can be tolerated by the memory chips on memory modules installed in the memory subsystem. A suitable upper limit may be, for example, about 3.9 volts, though it is foreseeable that higher voltages could be tolerated. The additional input voltage (and resulting drive current) supplied by the device 10 to the memory subsystem improves memory performance by causing the memory chips on the memory modules to run at higher frequencies, such that the various internal operations of the memory, such as reading and writing, occur more quickly. This capability shortens the lag between demand and supply within the memory subsystem, and shortens the lag between reduced demand and power throttling.

Figure 2:
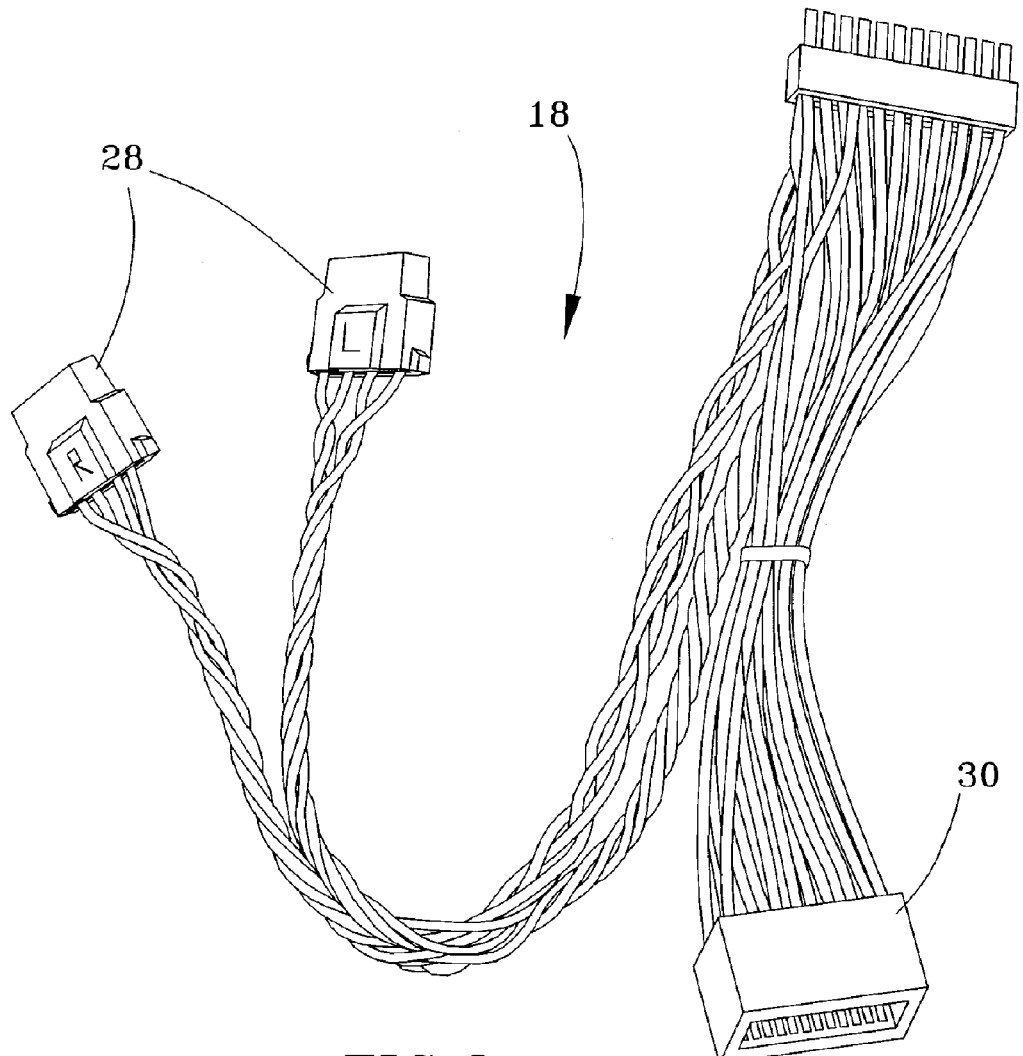
FIG. 2 shows cables for connecting the device of FIG. 1 to a power source.
Figure 3:
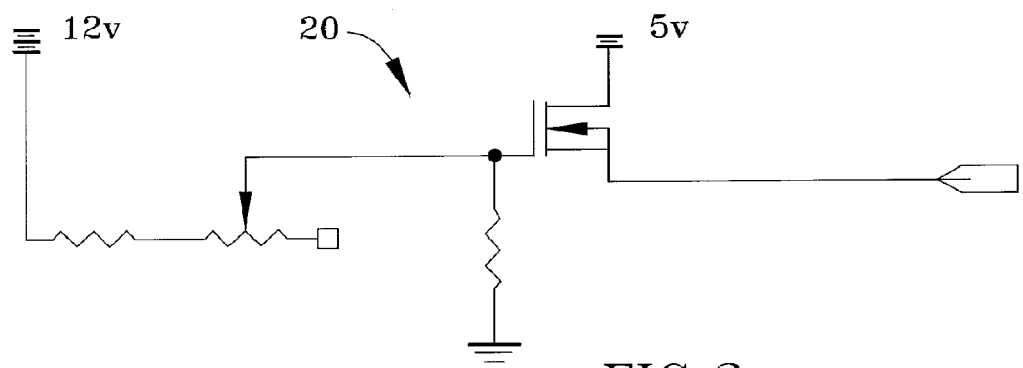
FIG. 3 is a schematic for a voltage adjustment circuit for use with the device of FIG. 1 in accordance with another preferred aspect of this invention.

FIG. 3 schematically represents a suitable circuit 22 for performing voltage adjustment through the knob 14. In the embodiment of FIG. 1 and with reference to FIG. 3, the variable resistor 16 controls the voltage supplied to the gates of four power NMOS MOSFET's, in parallel. Preferably, the resistor 16 is also connected, in series, to a maximum voltage limiting resistor to establish an appropriate upper limit for the adjustment range (e.g., about 3.9 volts), which in turn is connected to a +12V line on the device 10 (also drawn from the PSU). Power is supplied to the device 10 from the computer's PSU (such as through the 5 volt line of the ATX PSU), and is fed to the device 10 through a pass-through cable 18 (FIG. 2) that connects directly to the PSU, e.g., a 20-pin ATX connector. The cable 18 is equipped with a pair of Molex connectors 28 for connecting to the connectors 26 of the device 10, and a connector 30 for connecting the cable 18 to the PSU. In this manner, the cable 18 is able to supply power from the 5 volt line of the PSU to the VDIMM on the motherboard through the source and drains of the four power MOSFET's on the device 10. The lines on the cable 18 are preferably redundant to split the current load equally so as not to be over the maximum current that each line can support.

Voltages needed for the voltage readout circuit 20 and voltage adjustment circuit 22 can also be drawn from the PSU of the computer. For example, FIGS. 3 and 4 indicate that +5V and −5V lines are used to run the A/D (analog to digital) converter and LED driver. The +12V line used in the voltage adjustment circuit 22 is also used as the input to the power MOSFET's on the device 10, which regulate the current and voltage supplied to VDIMM. A heatsink 32 is seen in FIG. 1 as being mounted to the device 10, and contacts the MOSFET's (beneath the heatsink 32) to help dissipate heat. Adequate heat dissipation is an important aspect of the invention, since the power dissipation of the MOSFET's used on the device 10 will generally be proportional to the square of the voltage being supplied to the memory modules. Accordingly, supplemental cooling by any suitable means is preferably employed.

Power filtering for the device 10 represented in FIG. 1 can be provided by several bypass capacitors (not shown) mounted on the device 10 between Ground and Vdd (VDIMM). Because Vref and Vtt on most motherboards will follow at half of Vdd (VDIMM), it is believed unnecessary to supply Vref or Vtt externally in the embodiment depicted in the Figures. However, other circumstances may necessitate that Vref and Vtt also be supplied. In the case of Vref, it could be supplied through DIMM pin 1 of the device 10 using a simple resistive divider network. Vtt would then be supplied with a "flying lead," soldered wire, or grabber that would attach to the MVRM MOSFET leg, or any other point, on the motherboard that is on the same line as Vtt. Both Vref and Vtt can be made adjustable through the use of variable resistors in essentially the same manner as done for VDIMM, i.e., through a potentiometer and adjustment circuitry similar to that of FIG. 3.

The device 10 shown in FIG. 1 provides the above-described benefits while being relatively inexpensive to produce. An alternative and potentially more preferable configuration for the device 10 entails the use of two PCB's, one that slots into the DIMM socket as a pass through (as described for the device 10 of FIG. 1 ) and a separate PCB that is interconnected with the PCB installed in the DIMM socket and contains the control and/or readout circuits 20 and 22. In such an embodiment, the second PCB can be located so that the readout 12 and control knob 14 are accessible through a front panel of the computer. Peripheral circuitry such as voltage readout, temperature readout, current readout, or any other related readout could also be included through the use of a conventional A/D converter. Instead of or in addition to the readout 12, any outputs of the device 10 can be sent to a LED, LCD, dot matrix, or directly to the computer for display on a monitor through software via a serial, parallel, USB, or Firewire interface. Alternatively, any such outputs could be displayed on the device 10, on a separate control unit, or implemented as a secondary circuit board that works in tandem with the device 10. In addition, and as with the readout 12 and knob 14 of the device 10 as described above, if such a display is attached to a separate control unit or as a secondary circuit board, it could be located and configured to be accessible through a front panel of the computer or an external display unit that is within easier viewing and reach than if the readout were integrated on that portion of the device 10 installed in a memory slot on the motherboard. Additionally and potentially preferred implementations of the invention can include the integration of additional MVRM in the device 10 such as used in server expansion cards. Finally, while the device 10 as described above is specifically configured to be physically installed in an available memory slot to electrically connect the device 10 to the available memory slot (and, as a result, the memory subsystem containing the memory slot), the device 10 could be configured for electrical connection with the memory subsystem through a separate interface means, such as a micro-grabber, one or more soldered wires, "flying lead," etc., connected to the motherboard.

For implementing the second approach of this invention, in which power from outside of the computer is routed via external circuitry, the device of FIG. 1 or any of the alternatives described above can be used. Those skilled in the art will appreciate that the second approach of this invention can be accomplished using a transformer circuit to convert AC power from any available wall socket into DC power, or through the use of any suitable DC power source. In either case, the additional power source delivers power to the device 10 through suitable cable connectors, essentially similar and potentially identical to the cable 18 shown in FIG. 2.

In the method of using any of the above-described embodiments to provide power to a computer's memory array, the device (e.g., 10 of FIG. 1) is simply installed in an available memory slot of the memory array such that the pins 24 are electrically connected to the memory bus through the memory slot. The cable 18 is then used to electrically connect the device 10 to the power source (e.g., the computer's internal PSU or a separate external power source), after which the computer is rebooted. During boot up, the user enters the BIOS of the computer and turns the knob 14 to adjust the input voltage delivered by the device 10 to the memory bus while monitoring the input voltage by observing the readout 12. Once the desired input voltage is obtained, the user saves and exits BIOS. It should be noted that once the device 10 is installed, voltage adjustments can be made during normal operation of the computer, during system idle, when the computer is off, etc.

While the invention has been described in terms of specific embodiments, it is apparent that other forms could be adopted by one skilled in the art. For example, the physical configuration of the device and its circuits could differ from those shown and described, and components, materials and processes other than those noted could be use. Therefore, the scope of the invention is to be limited only by the following claims.

What is claimed is:

1. An apparatus for increasing power to at least one memory module in at least a first of a plurality of memory slots of a memory subsystem associated with a motherboard of a computer, the apparatus comprising means for supplying an input voltage to the memory module of the memory subsystem at a level that is higher than a power level provided to the memory subsystem by the motherboard, the input voltage supplying means having a portion configured to plug directly into an available second memory slot of the memory subsystem and is thereby linked to a memory bus of the memory subsystem to deliver the input voltage to the memory module in the first memory slot.

2. The apparatus according to claim 1, wherein the higher level of the input voltage is such that memory performance of the memory subsystem is improved by causing memory chips on the memory module to run at higher frequencies.

3. The apparatus according to claim 1, wherein the input voltage is in excess of available voltage present on a motherboard within the computer.

4. The apparatus according to claim 1, wherein the input voltage is in excess of 3.3 volts.

5. The apparatus according to claim 1, wherein the apparatus further comprises cable means that delivers a supply voltage from a power source to the input voltage supplying means.

6. The apparatus according to claim 5, wherein the power source is external of the computer and comprises an AC/DC converter.

7. The apparatus according to claim 5, wherein the power source is external of the computer and comprises a DC power source.

8. The apparatus according to claim 5, wherein the power source is a power supply unit within the computer.

9. The apparatus according to claim 5, wherein the power source supplies at least five volts to the input voltage supplying means.

10. The apparatus according to claim 1, wherein the second memory slot is on a motherboard of the computer.

11. The apparatus according to claim 1, wherein the input voltage supplying means comprises at least a first printed circuit board and the portion of the input voltage supplying means comprises electrical pins along an edge of the first printed circuit board, the edge of the first printed circuit board being configured to be received in the second memory slot and the pins being configured for making electrical contact with the second memory slot.

12. The apparatus according to claim 11, wherein the input voltage supplying means further comprises means for displaying the input voltage delivered by the input voltage supplying means to the memory subsystem, the displaying means not being located on the first printed circuit board.

13. The apparatus according to claim 11, wherein the input voltage supplying means further comprises means for adjusting the input voltage delivered by the input voltage supplying means to the memory subsystem, the adjusting means not being located on the first printed circuit board.

14. The apparatus according to claim 1, wherein the input voltage supplying means comprises means for displaying the input voltage delivered by the input voltage supplying means to the memory subsystem.

15. The apparatus according to claim 1, wherein the input voltage supplying means comprises means for adjusting the input voltage delivered by the input voltage supplying means to the memory subsystem.

16. The apparatus according to claim 1, wherein the memory subsystem comprises DIMM memory modules.

17. A method of providing power to at least one memory module in at least a first of a plurality of memory slots of a memory subsystem of a computer, the method comprising the steps of:
   electrically connecting a supply means to an available memory slot of the memory subsystem;
   electrically connecting a power source to the supply means so that the supply means generates an input voltage; and
   delivering the input voltage to the memory module through a memory bus of the memory subsystem to deliver the input voltage to the memory module in the first memory slot.

18. The method according to claim 17, wherein the input voltage is in excess of available voltage present on a motherboard within the computer.

19. The method according to claim 17, wherein the input voltage is in excess of 3.3 volts.

20. The method according to claim 17, wherein the power source is external of the computer.

21. The method according to claim 17, wherein the power source is a power supply unit within the computer.

22. The method according to claim 17, wherein the power source supplies at least five volts to the supply means.

23. The method according to claim 17, wherein the available memory slot is on a motherboard of the computer.

24. The method according to claim 17, further comprising the step of displaying the input voltage delivered by the supply means to the memory subsystem.

25. The method according to claim 17, further comprising the step of adjusting the input voltage delivered by the supply means to the memory subsystem.

26. The method according to claim 25, wherein the adjusting step comprises the steps of:
   rebooting the computer after the electrically connecting;
   entering the BIOS of the computer;
   adjusting the input voltage delivered by the supply means to the memory subsystem whereupon the supply means delivers the input voltage to the memory subsystem; and then
   saving and exiting the BIOS.

27. The method according to claim 25, wherein the adjusting step is performed during operation of the computer.

28. The method according to claim 25, wherein the adjusting step is performed during system idle of the computer.

29. The method according to claim 25, wherein the adjusting step is performed when the computer is off.

30. The method according to claim 17, wherein the step of electrically connecting the supply means to the available memory slot comprises physically installing the supply means into the available memory slot.

31. The method according to claim 17, wherein the memory subsystem comprises DIMM memory modules.

32. The method according to claim 17, wherein the step of electrically connecting the supply means to the available memory slot does not comprise physically installing the supply means into the available memory slot but instead comprises using a separate interface means to electrically couple the supply means and the memory subsystem.

* * * * *